US009253915B2

(12) United States Patent
Mao

(10) Patent No.: US 9,253,915 B2
(45) Date of Patent: Feb. 2, 2016

(54) LATCH MECHANISM

(71) Applicant: Wistron Corp., New Taipei (TW)

(72) Inventor: Zhong-Hui Mao, New Taipei (TW)

(73) Assignee: Wistron Corp., New Taipei (TW)

( * ) Notice: Subject to any disclaimer, the term of this patent is extended or adjusted under 35 U.S.C. 154(b) by 122 days.

(21) Appl. No.: 14/272,473

(22) Filed: May 7, 2014

(65) Prior Publication Data

US 2015/0173217 A1   Jun. 18, 2015

(30) Foreign Application Priority Data

Dec. 16, 2013 (CN) .......................... 2013 1 0688611

(51) Int. Cl.
*G06F 1/16* (2006.01)
*H05K 7/14* (2006.01)
*G06F 1/18* (2006.01)

(52) U.S. Cl.
CPC .............. *H05K 7/1489* (2013.01); *G06F 1/183* (2013.01); *H05K 7/1411* (2013.01)

(58) Field of Classification Search
USPC ................ 312/332.1, 265.6, 199, 204, 223.2, 312/223.1, 111, 215, 289, 71, 326, 352, 312/222; 249/86, 219.1; 235/385, 137; 248/471, 448, 550, 157, 125.1, 352, 248/429, 458, 113, 316, 423, 129; 361/679.33, 679.55, 679.38, 679.39, 361/679.53, 679.01, 679.58; 345/173, 168, 345/690, 104, 156, 163, 629, 175, 174, 169
See application file for complete search history.

(56) References Cited

U.S. PATENT DOCUMENTS

| 8,734,312 | B2 * | 5/2014 | Conner | ............. | A61B 19/2203 600/1 |
| 2012/0261368 | A1 * | 10/2012 | Klein | .................. | A47B 81/005 211/64 |
| 2015/0254940 | A1 * | 9/2015 | Graef | ..................... | G07F 19/20 700/242 |

FOREIGN PATENT DOCUMENTS

CN        200956260 Y      10/2007

OTHER PUBLICATIONS

Taiwan Patent Office, Office Action, Patent Application Serial No. 103100146, Jul. 24, 2015, Taiwan.

* cited by examiner

Primary Examiner — Hung Duong

(57) ABSTRACT

A latch mechanism is provided, including a rack having a restricting structure and a linkage assembly connected to an electronic device in the rack. The linkage assembly includes a fixed frame, connected to the electronic device; a sliding frame, movable along a first direction relative to the fixed frame; a handle, connected to the sliding frame; a trigger, movably disposed between the handle and the sliding frame; and a latch member, connected to the fixed frame and the restricting structure to restrict the electronic device in the rack. When an external force is exerted on the trigger and the handle to move the sliding frame along the first direction relative the fixed frame, the trigger pushes the latch member to separate from the restricting structure along a second direction perpendicular to the first direction, such that the electronic device can be drawn out of the rack.

10 Claims, 16 Drawing Sheets

LATCH MECHANISM

CROSS REFERENCE TO RELATED APPLICATIONS

The present application claims priority of China Patent Application No. 201310688611.5, filed on Dec. 16, 2013, the entirety of which is incorporated by reference herein.

BACKGROUND OF THE INVENTION

1. Field of the Invention

The present application relates to a latch mechanism, and in particular to a latch mechanism applicable to a Blade server system.

2. Description of the Related Art

With the rapid development of cloud computing, the computing ability of electronic devices is becoming increasingly important. Presently, the Blade server system is one of the platforms employed to meet the demands of cloud computing.

In general, a Blade server system primarily includes a rack and several blade servers therein. The rack may have an Optical-Disk-Drive (ODD) module, a network module, a power module, and a fan module etc. disposed therein, and each of the blade servers has the feature of hot swapping. However, the blade servers arranged in the rack are very close to each other, it is therefore a challenge to rapidly and conveniently lock the blade servers in the rack or draw the blade servers out of the rack for reducing the maintenance time of the system.

BRIEF SUMMARY OF THE INVENTION

An embodiment of the invention provides a latch mechanism, including a rack having a restricting structure and a linkage assembly connected to an electronic device in the rack. The linkage assembly includes a fixed frame, connected to the electronic device; a sliding frame, movable along a first direction relative to the fixed frame; a handle, connected to the sliding frame; a trigger, movably disposed between the handle and the sliding frame; and a latch member, connected to the fixed frame and the restricting structure to restrict the electronic device in the rack. When an external force is exerted on the trigger and the handle to move the sliding frame along the first direction relative the fixed frame, the trigger pushes the latch member to separate from the restricting structure along a second direction perpendicular to the first direction, such that the electronic device can be drawn out of the rack.

In another embodiment, the linkage assembly further includes a locking member disposed on the sliding frame and engaged with the fixed frame to restrict the sliding frame moving relative to the fixed frame.

In another embodiment, the trigger is movably connected to the sliding frame, and when the trigger moves along the first direction relative to the sliding frame, the trigger pushes the locking member to deform and separate from the fixed frame.

In another embodiment, when the trigger moves along the first direction relative to the sliding frame, the trigger pushes the locking member to deform along a third direction, perpendicular to the first direction and the second direction.

In another embodiment, the trigger includes a rod body, a first contact portion, and a second contact portion, wherein the rod body is extended along the first direction, and the first and second contact portions protrude from the rod body toward the second direction.

In another embodiment, when the trigger moves along the first direction relative to the sliding frame, the first contact portion pushes the locking member to deform and separate from the fixed frame.

In another embodiment, when the trigger moves along the first direction relative to the sliding frame and pushes the latch member, the second contact portion pushes the latch member to separate from the restricting structure along the second direction.

In another embodiment, the latch member includes an inclined surface, and when the trigger pushes the latch member, the trigger pushes the inclined surface to separate the latch member from the restricting structure along the second direction.

In another embodiment, the linkage assembly further includes a first spring connected to the sliding frame and the trigger.

In another embodiment, the linkage assembly further includes a second spring connected to the fixed frame and the latch member.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
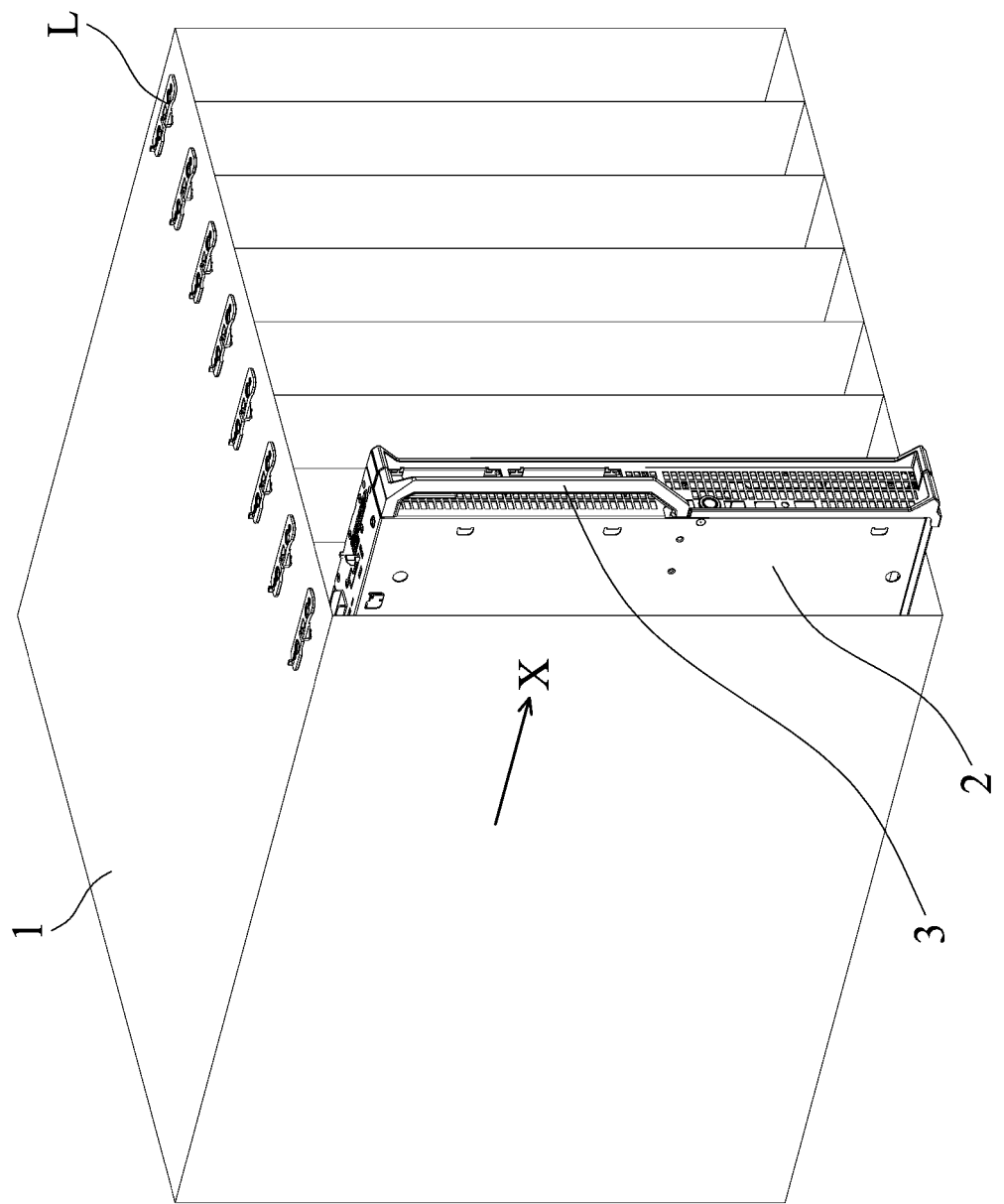
FIG. 1 is a schematic view of a Blade server system according to an embodiment.

Referring to FIG. 1, a Blade server system according to an embodiment includes a rack 1 and several blade servers 2 (FIG. 1 only shows a blade server for illustration). The rack 1 includes several receiving spaces for receiving the blade servers 2, and several restricting structures L are disposed on a side of the rack 1 and correspond to the receiving spaces, respectively. Moreover, each of the blade servers 2 is connected to a linkage assembly 3. In this embodiment, the linkage assembly 3 and the restricting structure L on the rack 1 form a latch mechanism for rapidly and conveniently locking the blade servers 2 in the rack 1 or drawing the blade servers 2 out of the rack 1 along the X direction, as shown in FIG. 1.

Figure 2A:
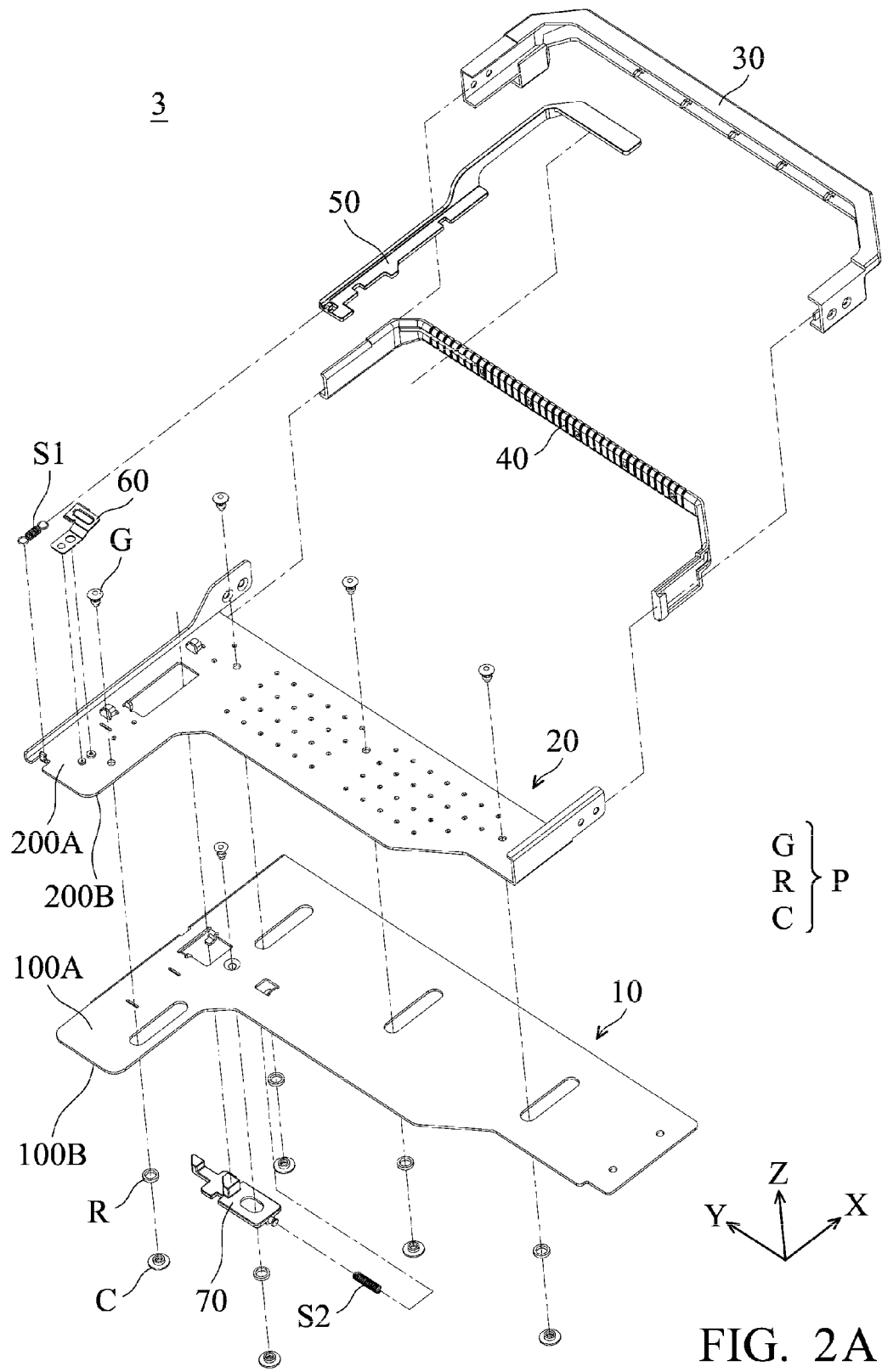
FIG. 2A is an exploded view of a linkage assembly according to an embodiment.
Figure 2B:
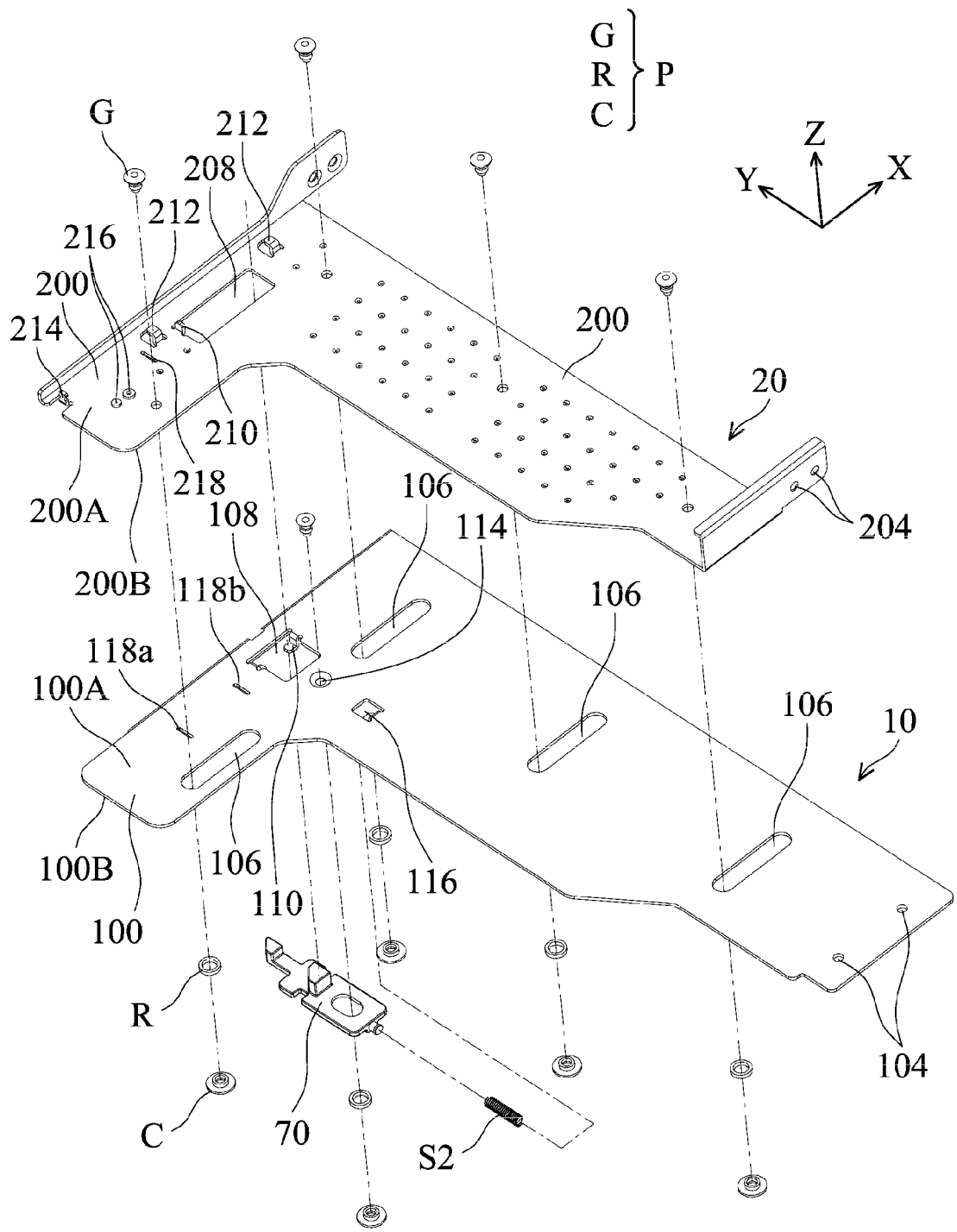
FIGS. 2B-2C are partial enlarged views of FIG. 2A.
Figure 2C:
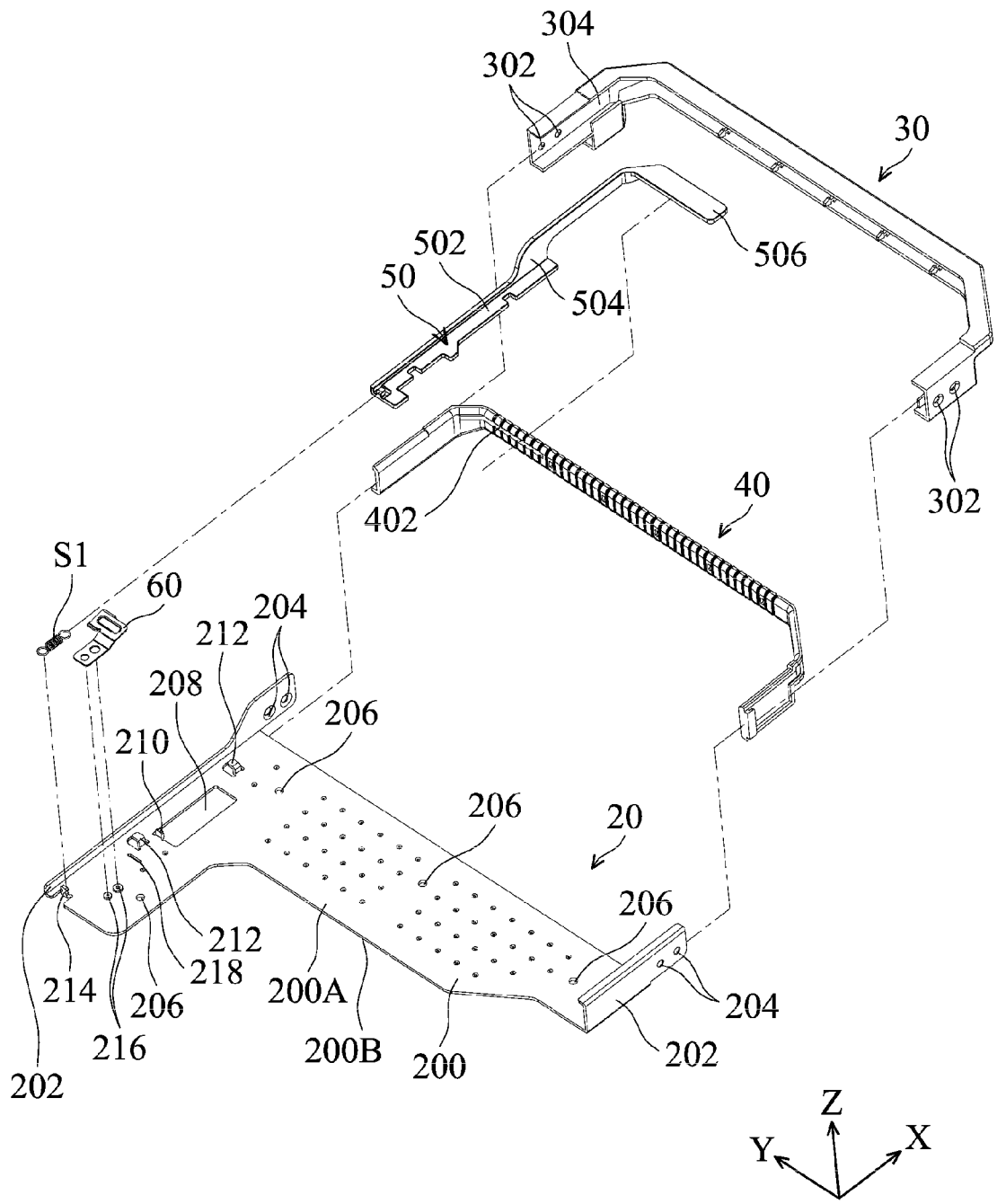
Figure 3A:
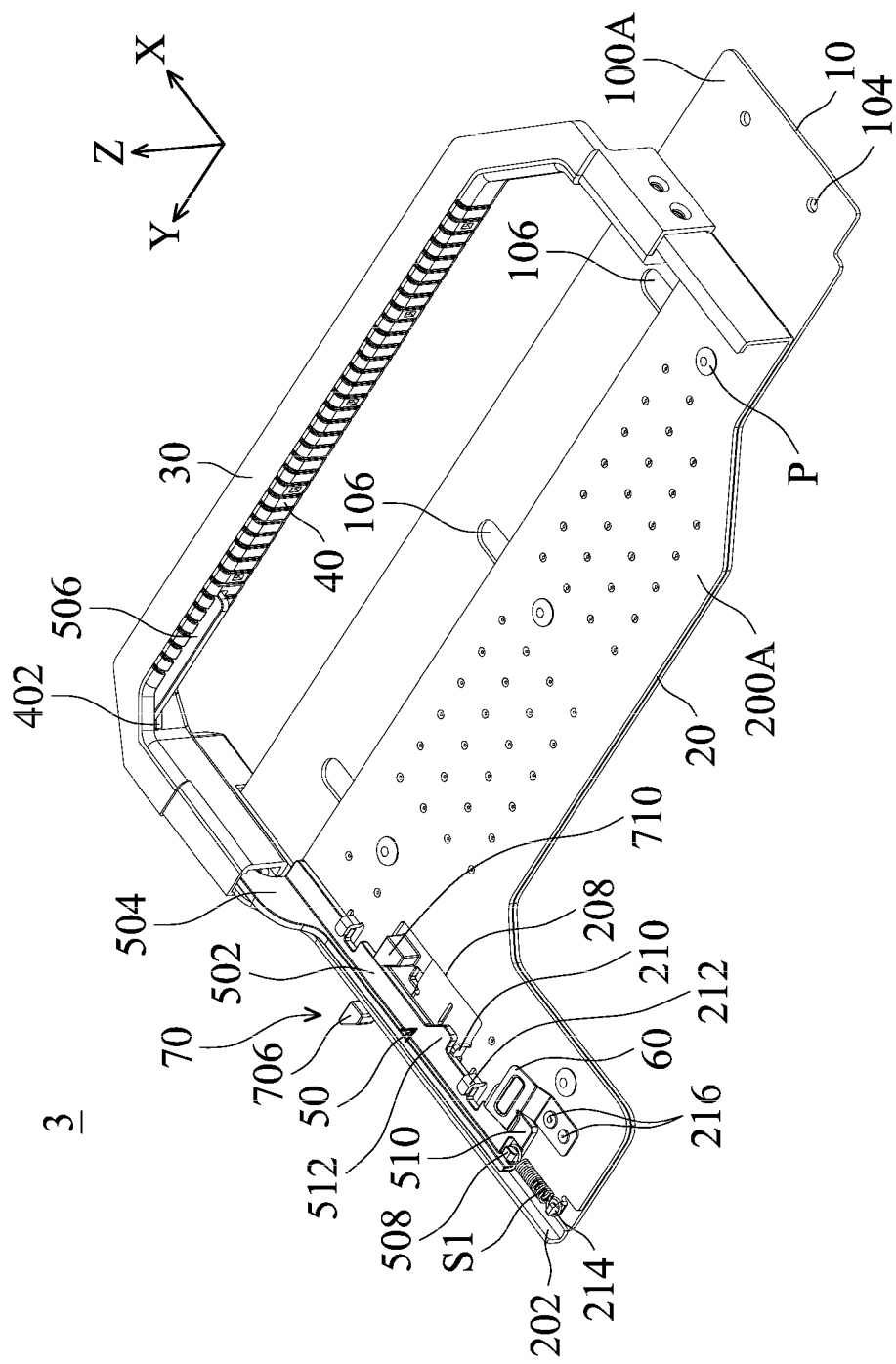
FIGS. 3A-3B are schematic views showing the linkage assembly when assembled from different viewing angles.
Figure 3B:
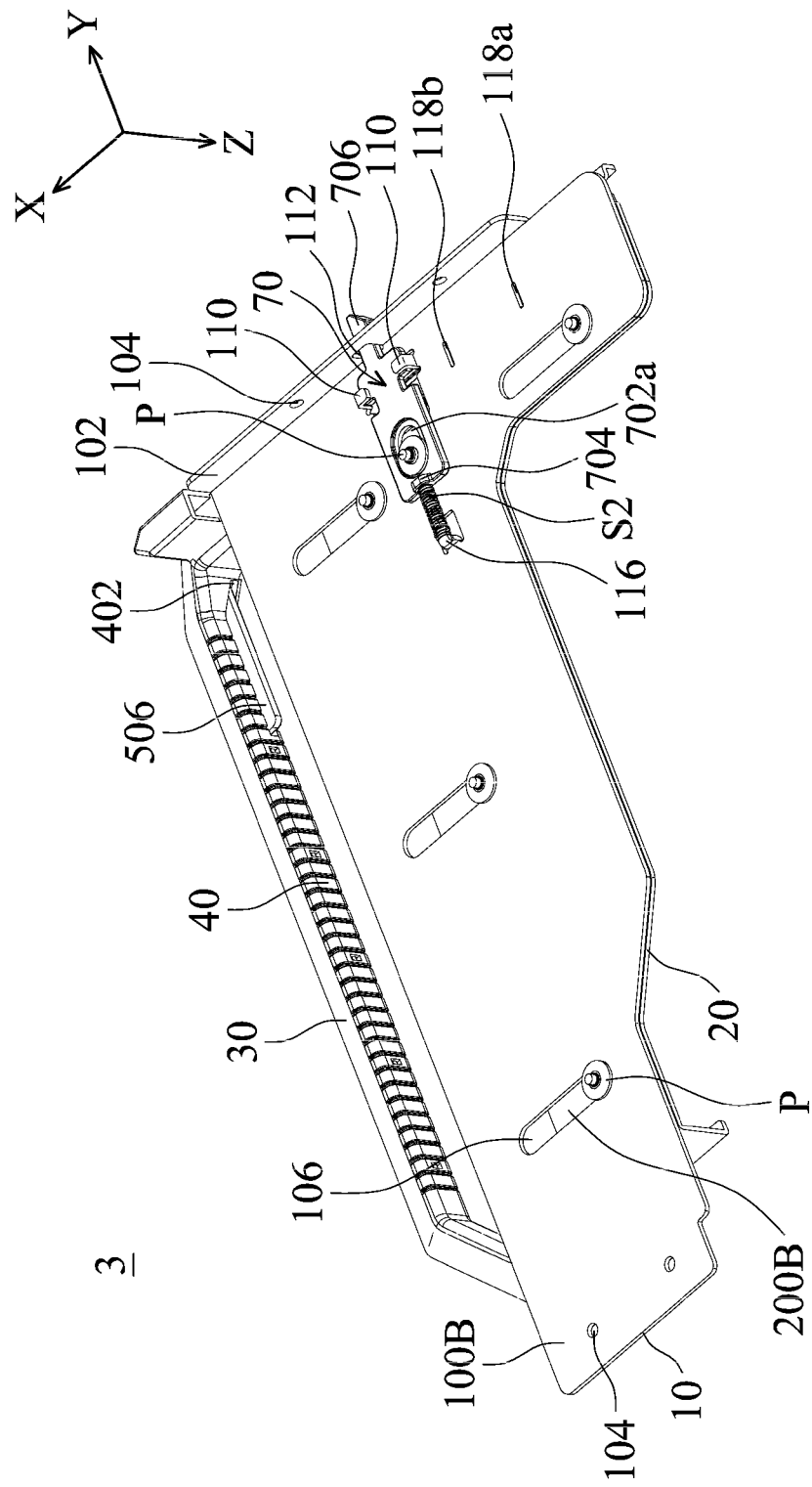

FIG. 2A is an exploded view of a linkage assembly 3 according to an embodiment, FIGS. 2B-2C are partial enlarged views of FIG. 2A, and FIGS. 3A-3B are schematic views showing the linkage assembly 3 when assembled from different viewing angles. Referring to FIGS. 2A-3B, the linkage assembly 3 is configured to connect the blade server 2 in FIG. 1, including a fixed frame 10, a sliding frame 20, a handle 30, a handle cover 40, a trigger 50, a locking member 60, a latch member 70, a first spring S1, a second spring S2, and several connecting units P (including rivets G, steel columns C, and rollers R).

The fixed frame 10 includes a main body 100 and a side-wall 102 (FIG. 3B). The main body 100 has an upper surface 100A and a lower surface 100B opposite to each other. The side-wall 102 is bent toward the −Z direction and protrudes from the lower surface 100B. Several holes 104 are formed on the side-wall 102 and the main body 100. Therefore, the fixed frame 10 can be fastened to the blade server 2 in FIG. 1 by the fasteners, such as rivets etc. penetrating through the holes 104.

Moreover, several guide channels 106 are formed on the main body 100 and extended along the X direction. An opening 108 is formed on the main body 100, and two bent portions 110 are extended from opposite sides of the opening 108 toward the −Z direction and protrude from the lower surface 100B. A hole 112 is formed on the side-wall 102 (FIG. 3B), and a rivet hole 114 is formed on the main body 100 (FIG. 2B), wherein the positions of the hole 112 and the rivet hole 114 substantially correspond to the opening 108. A fixed portion 116 also protrudes from the lower surface 100B. The main body 100 further forms multiple recesses 118a and 118b thereon. In the embodiment, the fixed frame 10 may comprise metal and can be formed by metal punching.

The sliding frame 20 includes a main body 200 and two side-walls 202 (FIG. 2C). The main body 200 has an upper surface 200A and a lower surface 200B opposite to each other. The side-walls 202 are bent toward the Z direction and protrude from the upper surface 200A. Several holes 204 are formed on the side-walls 202.

As shown in FIGS. 2B-2C, the main body 200 forms several rivet holes 206 thereon. It should be noted that, with the connecting units P penetrating through the rivet holes 206 and the guide channels 106 on the fixed frame 10, the sliding frame 20 is movable along the X direction relative to the fixed frame 10. Moreover, an opening 208 is formed on the main body 200 and substantially corresponds to the opening 108 on the fixed frame 10. A restricting portion 210 is extended from a side of the opening 208 and protrudes from the upper surface 200A. Several bent portions 212 protrude from the upper surface 200A and are situated on opposite sides of the opening 208. A fixed portion 214 and several joining portions 216 also protrude from the upper surface 200A. The main body 200 further forms a recess 218 thereon. In this embodiment, the sliding frame 20 may comprise metal and can be formed by metal punching.

As shown in FIG. 2C, the handle 30 has a bent shape, and several holes 302 are formed on two ends of the handle 30. With the fasteners, such as rivets or the like penetrating through the holes 302 and the holes 204 on the sliding frame 20, the sliding frame 20 and the handle 30 can be connected to each other. Accordingly, the handle 30 and sliding frame 20 can move together along the X direction relative to the fixed frame 10. The handle 30 also has a hollow space 304 for receiving the trigger 50. In this embodiment, the handle 30 may comprise zinc alloy and can be integrally formed in one piece. The handle cover 40 and the handle 30 can be connected to each other, to provide comfortable grip for users. In this embodiment, the handle cover 40 may comprise plastic and can be integrally formed in one piece.

As shown in FIG. 2C and FIG. 3A, the trigger 50 is movably disposed between the handle 30 and the sliding frame 20, including a rod body 502, an extension portion 504, and a shaft 506, wherein the extension portion 504 connects the rod body 502 with the shaft 506. The rod body 502 is substantially extended along the X direction and adjacent to one of the side-walls 202 of the sliding frame 20. Specifically, the rod body 502 is restricted by the bent portions 212 on the sliding frame 20 and is movable only along the X direction. The shaft 506 is substantially extended along the Y direction and exposed to a surface of the handle cover 40 through a corresponding opening 402 thereof, thus facilitating convenient operation for the user.

Figure 4:
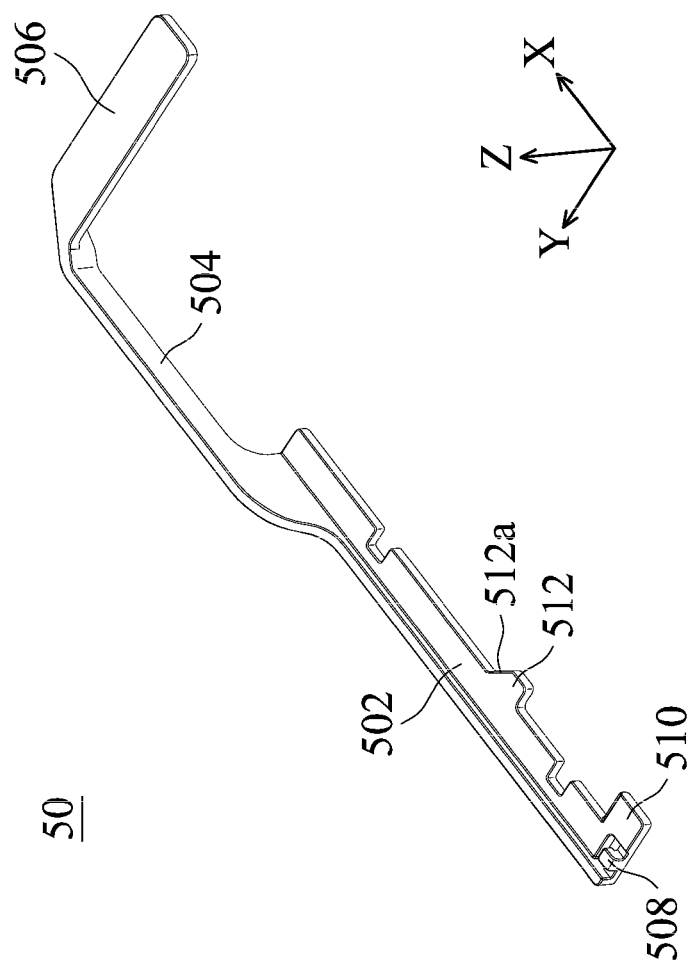
FIG. 4 is a schematic view of the trigger in FIG. 2A.

FIG. 4 is a schematic view of the trigger 50 in FIG. 2A. As shown in FIG. 4, a connecting portion 508 is formed at an end of the rod body 502 and extended toward the Z direction. Specifically, the two ends of the first spring 51 are respectively connected to the connecting portion 508 and the fixed portion 214 of the sliding frame 20 (FIG. 3A). Moreover, a first contact portion 510 is formed on a side of the connecting portion 508 and protrudes from the rod body 502 toward the −Y direction. A second contact portion 512 also protrudes from the rod body 502 toward the −Y direction and forms an inclined surface 512a. Note that, in FIG. 3A, the restricting portion 210 on the sliding frame 20 can restrict the second contact portion 512 moving along the −X direction. In this embodiment, the trigger 50 may comprise zinc alloy and can be integrally formed in one piece.

Figure 5:
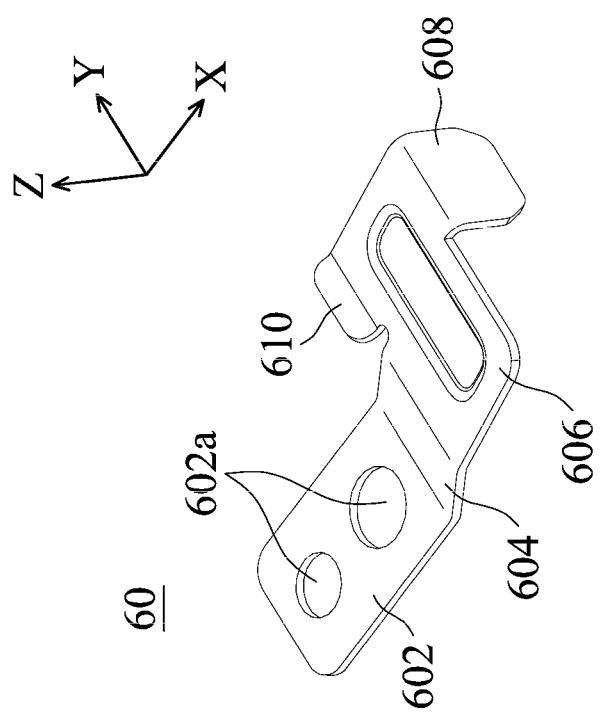
FIG. 5 is a schematic view of the locking member in FIG. 2A.

Referring to FIG. 5, which is a schematic view of the locking member 60 in FIG. 2A, the locking member 60 includes a fixed portion 602, an extension portion 604, and a deformable portion 606. The extension portion 604 connects the fixed portion 602 with the deformable portion 606, and an angle is formed between the extension portion 604 and the XY plane, such that the deformable portion 606 is slightly higher than the fixed portion 602 in the Z direction. Several holes 602a are formed on the fixed portion 602 and engaged with the joining portions 216 on the sliding frame 20 (FIG. 2C). Accordingly, the locking member 60 can be secured on the sliding frame 20.

Moreover, a protrusion 608 and a bent portion 610 are formed on opposite sides of the deformable portion 606. The protrusion 608 is extended from the deformable portion 606 toward the −Z direction. The bent portion 610 is extended form the deformable portion 606 toward the upside, and an obtuse angle is formed between the bent portion 610 and the deformable portion 606. In this embodiment, when the protrusion 608 penetrates through the recess 218 of the sliding frame 218 and is engaged with the recess 118a or 118b of the fixed frame 10 (FIG. 2B), the relative motion between the sliding frame 20 and the fixed frame 10 is prohibited, such that the sliding frame 20 and the fixed frame 10 are in a locked state. In this embodiment, the locking member 60 may comprise stainless steel and can be formed by punching.

Figure 6:
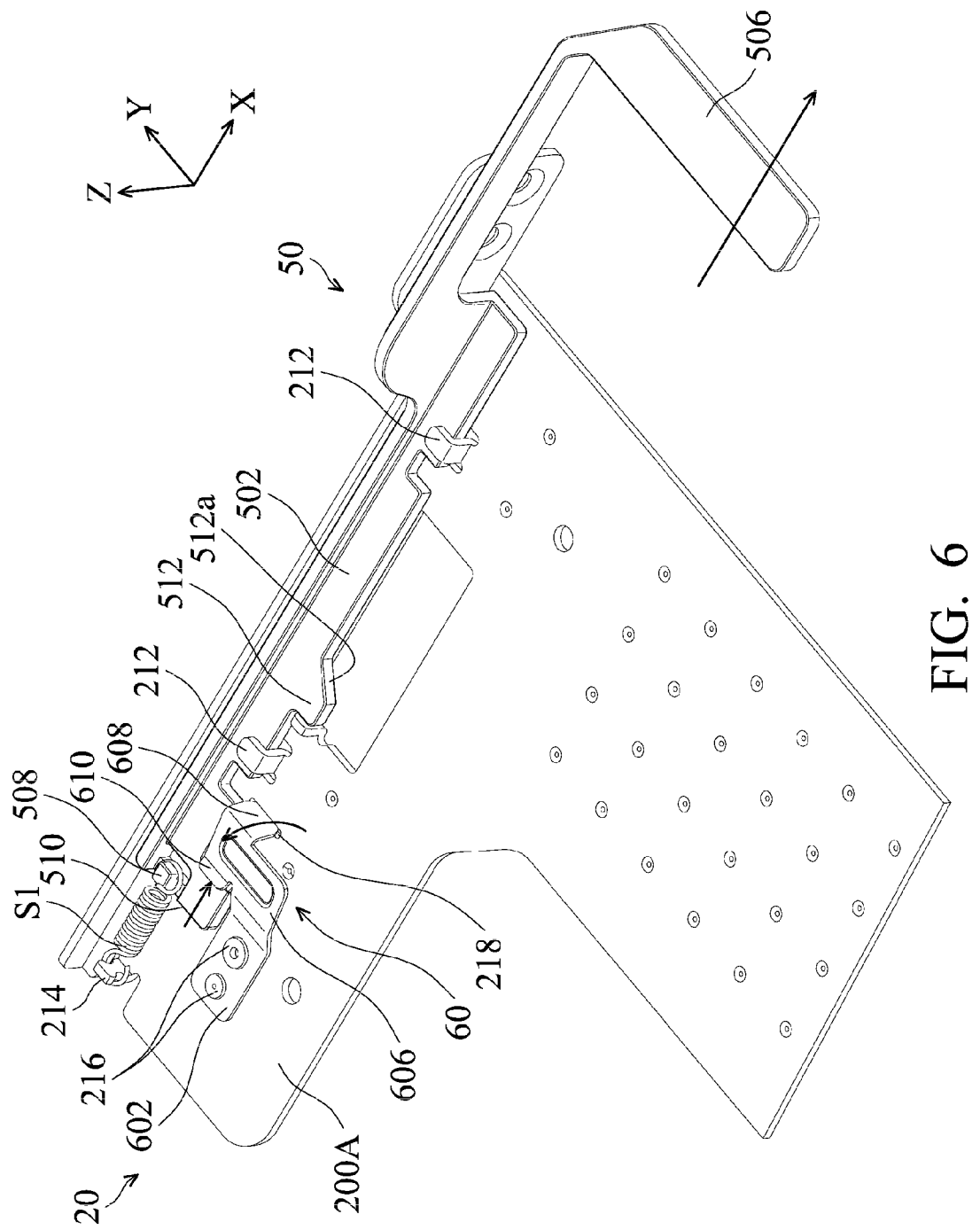
FIG. 6 is a schematic view showing the trigger and the locking member assembled on a sliding frame.

FIG. 6 is a schematic view showing the trigger 50 and the locking member 60 assembled on the sliding frame 20. As shown in FIG. 6, when the trigger 50 moves along the X direction relative to the sliding frame 20, the first contact portion 510 of the trigger 50 contacts the locking member 60 and slides to the bottom of the deformable portion 606, such that the deformable portion 606 and the protrusion 608 are deformed and lifted along the Z direction. Therefore, the protrusion 608 is separated from the recess 218 of the sliding frame 20 and the recess 118a or 118b of the fixed frame 10, such that the locked state between the fixed frame 10 and the sliding frame 20 is released.

Figure 7:
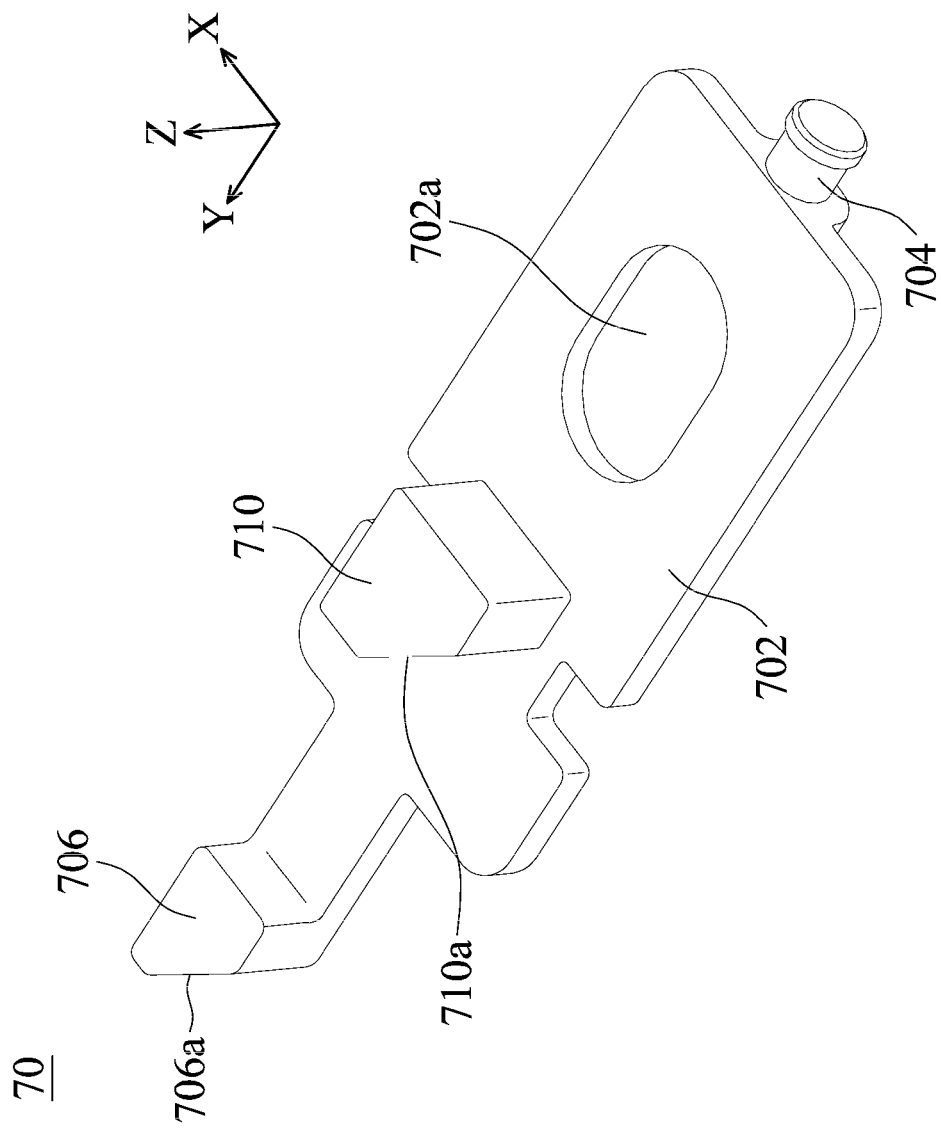
FIG. 7 is a schematic view of the latch member in FIG. 2A.

Referring to FIG. 7, which is a schematic view of the latch member 70 in FIG. 2A, the latch member 70 includes a main body 702 with an oval-shaped opening 702a formed thereon. With a connecting unit P penetrating through the opening 702a and the rivet hole 114 on the fixed frame 10 (FIG. 2B), the latch member 70 is movable along the Y direction relative to the fixed frame 10.

The latch member 70 also includes a connecting portion 704 and a latch portion 706 formed on opposite sides of the main body 702. As shown in FIG. 3B, the two ends of the second spring S2 are respectively connected to the connecting portion 704 and the fixed portion 116 protruding from the lower surface 100B of the fixed frame 10. Moreover, the latch portion 706 is extended from the main body 702 toward the Y direction, and an end of the latch portion 706 forms a protrusion extended toward the Z direction with an inclined surface 706a. In this embodiment, when the latch member 70 is assembled on the lower surface 100B of the fixed frame 10, the latch portion 706 penetrates through the hole 112 on the side-wall 102 of the fixed frame 10. The bent portions 110 of the fixed frame 10 can restrict the latch member 70 moving only along the Y direction.

Still referring to FIG. 7, the latch member 70 also includes a second protrusion 710 extended from the main body 702 toward the Z direction with an inclined surface 710a. When the latch member is assembled on the lower surface 100B of the fixed frame 10, the second protrusion 710 penetrates through the opening 108 on the fixed frame 10 and the opening 208 on the sliding frame 20, and protrudes from the upper surface 200A of the sliding frame 20 (FIG. 3A).

It is noted that, when the locked state between the fixed frame 10 and the sliding frame 20 is released, and the sliding frame 20 and the trigger 50 further move along the X direction relative to the fixed frame 10, the second contact portion 512 of the trigger 50 contacts the inclined surface 710a of the second protrusion 710 of the latch member 70 by the inclined surface 512a thereof. In this embodiment, the latch member 70 may comprise zinc alloy and can be integrally formed in one piece.

Referring to FIGS. 8A-8F in sequence, FIGS. 8A-8F are schematic views showing an embodiment of a latch mechanism comprising the linkage assembly 3 and the restricting structure L on the rack 1 (FIG. 1) during operation.

Figure 8A:
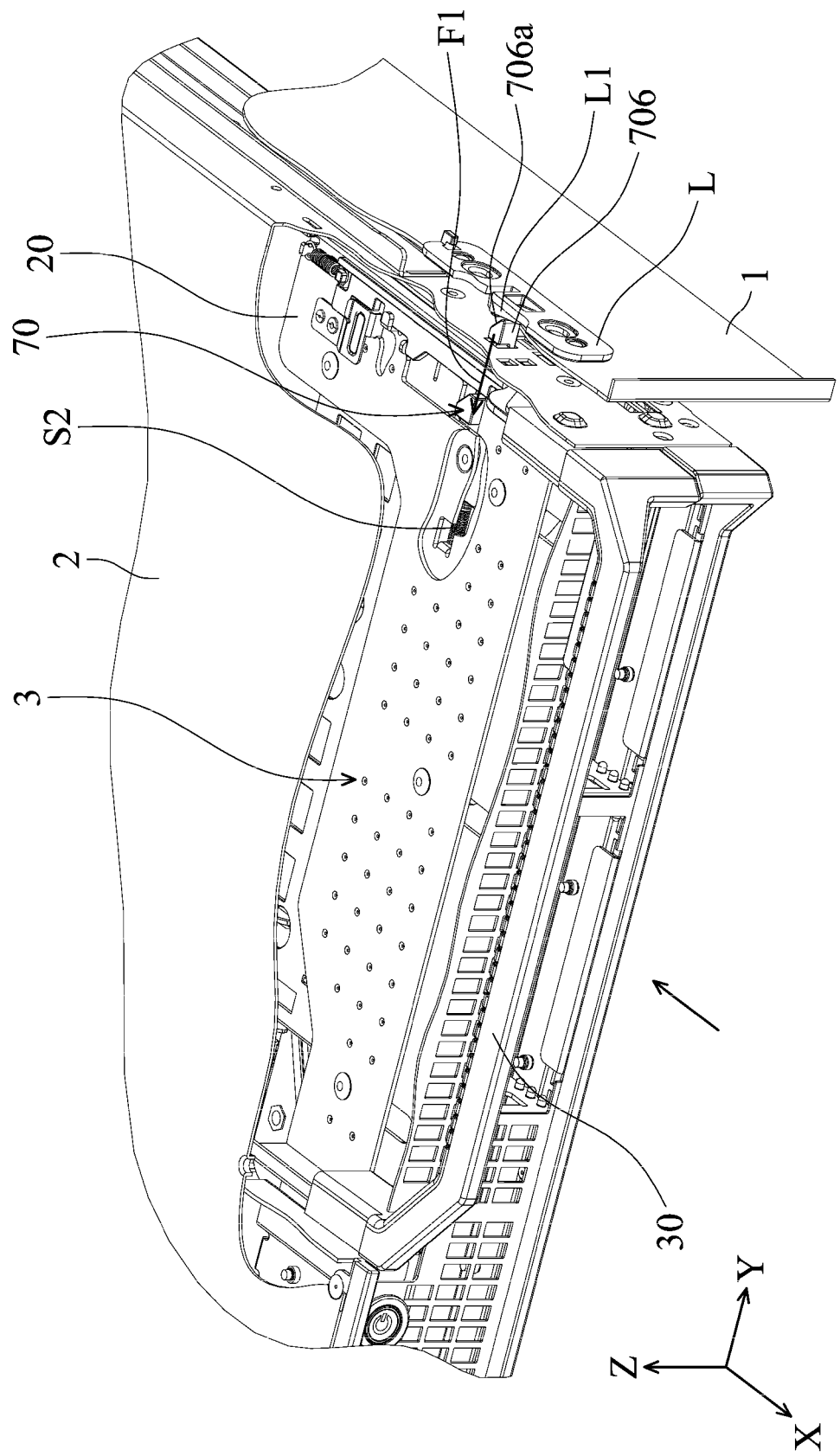
FIGS. 8A-8F are schematic views showing an embodiment of a latch mechanism during operation.

As shown in FIG. 8A, when a blade server 2 coupled with the linkage assembly 3 is inserted along the −X direction into a receiving space (not shown) of the rack 1, the restricting structure L on the rack 1 contacts the latch portion 706 of the latch member 70 through a protrusion L1 thereof and exerts a component of force F1 on the inclined surface 706a, thereby pushing the latch portion 706 to move along the −Y direction. Accordingly, the latch portion 706 of the latch member 70 moves through the protrusion L1 of the restricting structure L.

Figure 8B:
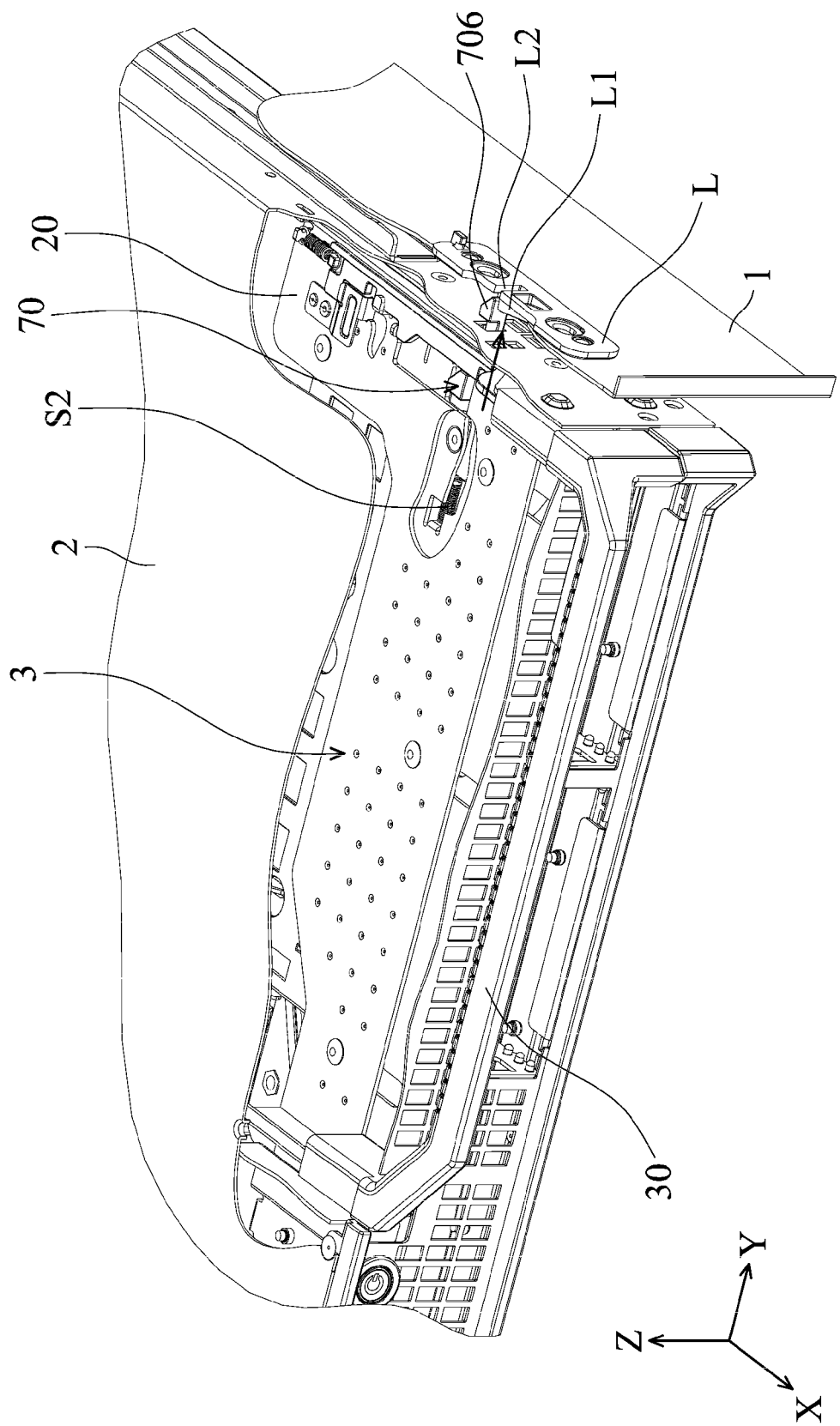

As shown in FIG. 8B, after the latch portion 706 moves through the protrusion L1, the component of force F1 is released. Meanwhile, the second spring S2 exerts an elastic force (as the arrow shows in FIG. 8B) on the latch member 70, such that the latch member 70 moves back along the Y direction. The second spring S2 in this embodiment is a compression spring, which can apply a recovery force to the latch member 70. In this embodiment, when the latch member 70 moves back along the Y direction, the latch portion 706 is engaged with a groove L2 of the restricting structure L, thus restricting the blade server 2 in the rack 1.

Figure 8C:
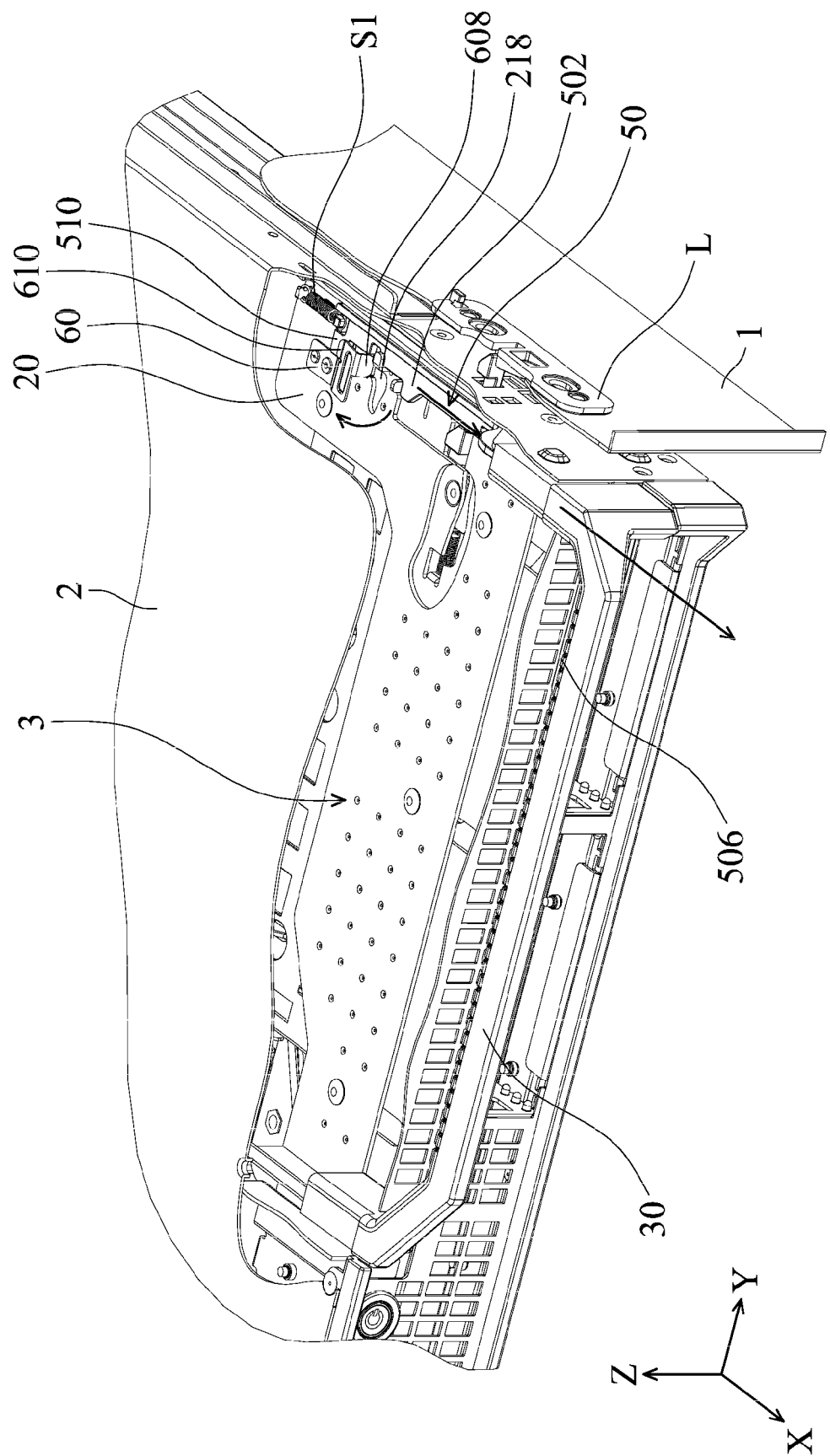

As shown in FIG. 8C, to draw the blade server 2 out of the rack 1, an external force can be exerted on the shaft 506 of the trigger 50 firstly, such that the trigger 50 is moved by a distance along the X direction relative to the handle 30 and the sliding frame 20 for expanding the first spring S1. In this embodiment, the first spring S1 is an expansion spring.

Note that, when the trigger 50 moves a distance along the X direction, the first contact portion 510 of the trigger 50 slides to the bottom of the deformable portion 606 of locking member 60 along the bent portion 610, such that the deformable portion 606 and the protrusion 608 of the locking member 60 are lifted along the Z direction (FIG. 6). Accordingly, the protrusion 608 is separated from the recess 218 of the sliding frame 20 and the recess 118a of the fixed frame 10, thus the sliding frame 20 starts moving along the X direction relative to the fixed frame 10.

Figure 8D:
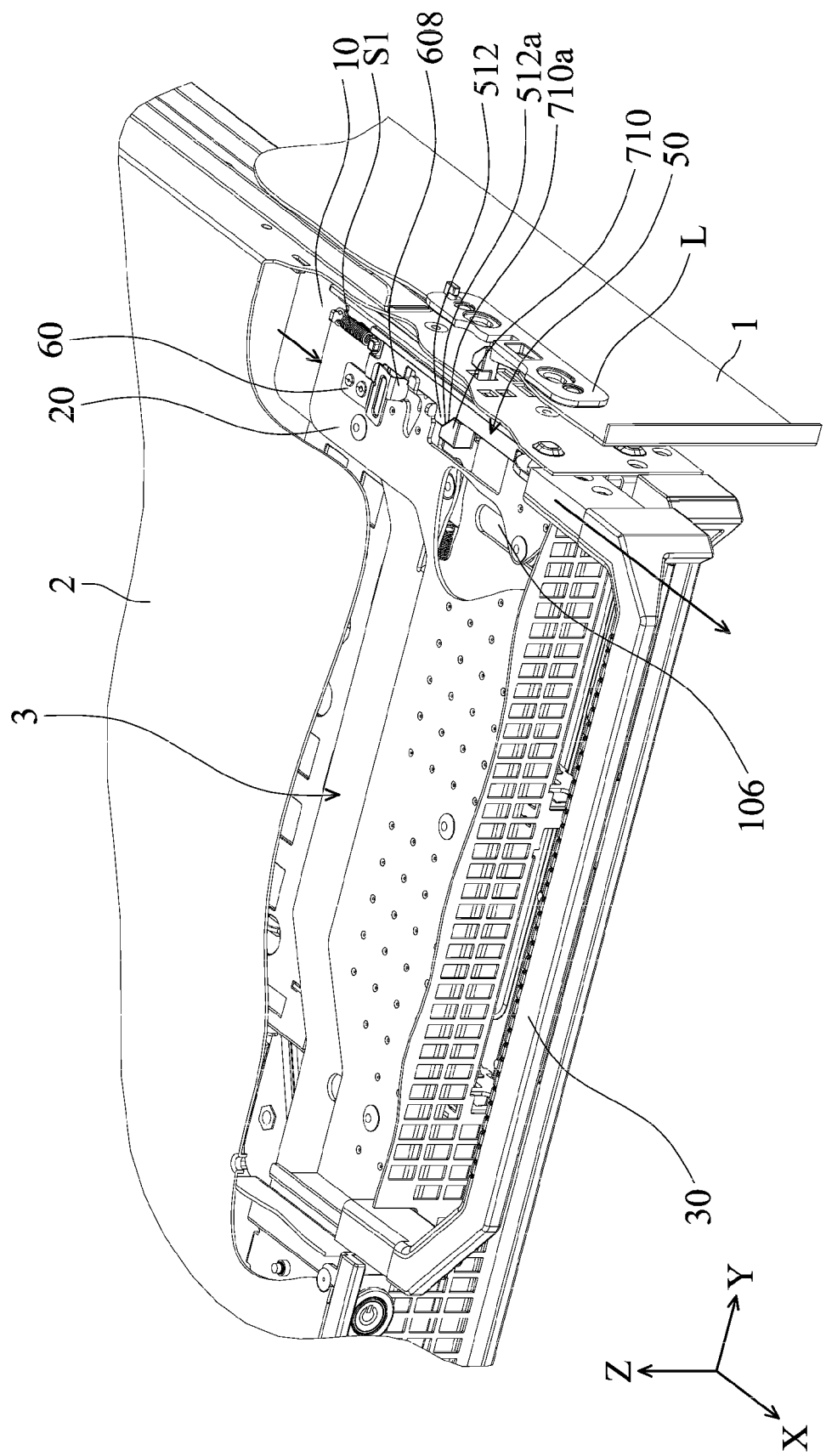

As shown in FIG. 8D, by continuously drawing the handle 30, the sliding frame 20 can be moved by a distance along the X direction relative to the fixed frame 10, until the inclined surface 512a of the second contact portion 512 of the trigger 50 contacts the inclined surface 710a of the second protrusion 710 of the latch member 70. It should be noted that, since the handle 30 and the sliding frame 20 can move a distance along the X direction in advance, it is convenient for the user holding the handle 30 to draw the blade server 2 out of the rack 1.

Figure 8E:
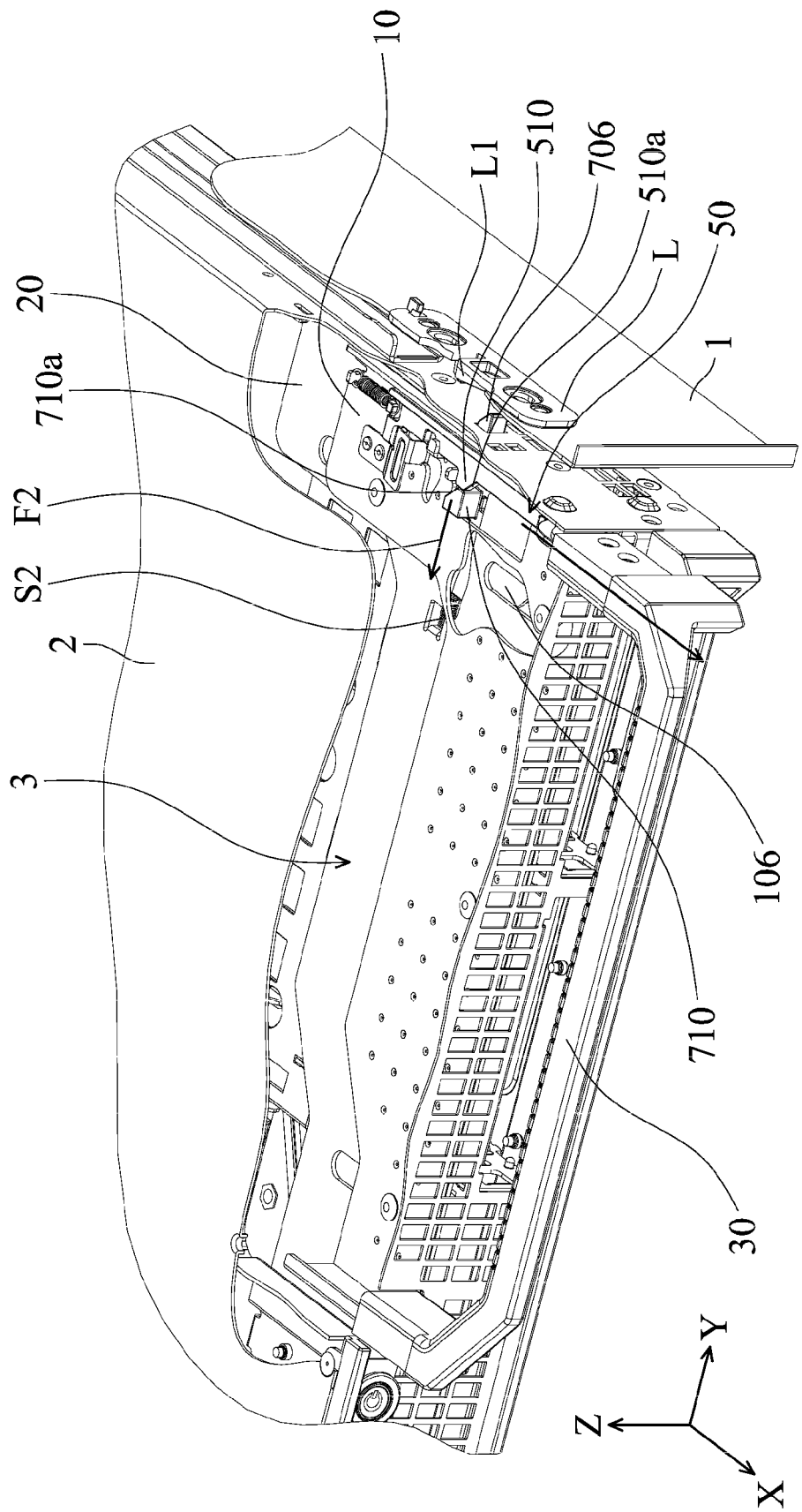

As shown in FIG. 8E, when the handle 30 is drawn further along the X direction, the second contact portion 512 of the trigger 50 exerts a second component of force F2 on the inclined surface 710a to move the latch member 70 along the −Y direction, such that the latch portion 706 of the latch member 70 separates from the groove L2. Accordingly, the latch portion 706 of the latch member 70 can move through the protrusion L1 of the restricting structure L, and the blade server 2 can be drawn out of the rack 1.

Figure 8F:
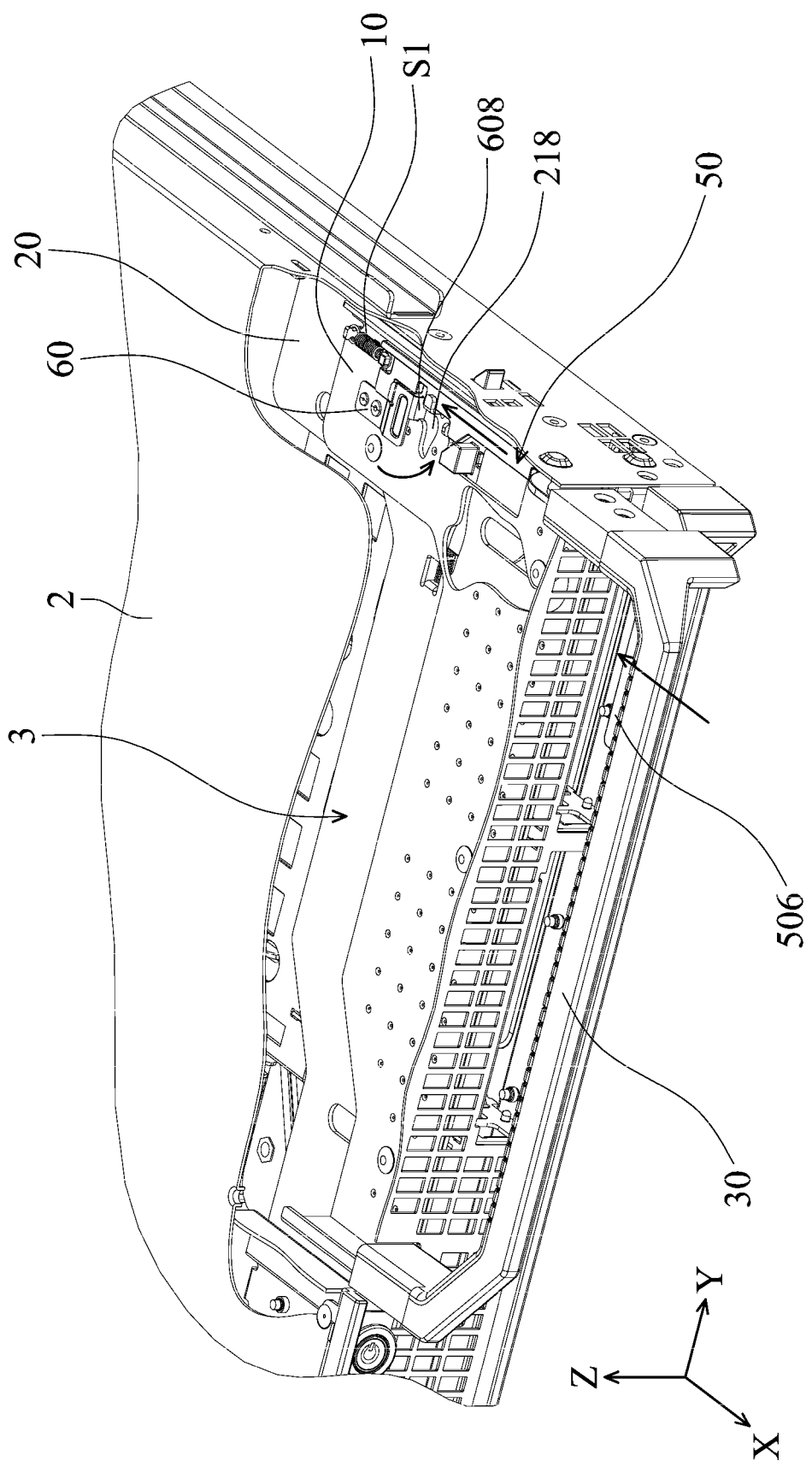

As shown in FIG. 8F, when the blade server 2 is drawn out of the rack 1 and the external force exerted on the shaft 506 of the trigger 50 is released, the first spring S1 exerts an elastic force on the trigger 50, such that the trigger 50 moves back along the −X direction. Therefore, the locking member 60 returns from a deformation state to an initial state. Meanwhile, the protrusion 608 of the locking member 60 moves downward along the −Z direction, and is engaged with the recess 218 of the sliding frame 20 and the recess 118b of the fixed frame 10, such that the sliding frame 20 can not move relative to the fixed frame 10.

It should be realized that FIG. 8F shows the linkage assembly 3 is in an open state, and FIG. 8A shows the linkage assembly 3 is in a closed state. In this embodiment, the protrusion 608 of the locking member 60 can be alternatively engaged with the recess 118a (FIG. 8A) or 118b (FIG. 8F) of the fixed frame 10, such that the linkage assembly 3 is in the open state or the closed state when the relative motion between the sliding frame 20 and the fixed frame 10 is prohibited (locked state), thus facilitating convenient operation of the linkage assembly 3 and saving the maintenance time thereof.

Additionally, when returning the linkage assembly 3 from the open state to the closed state, the shaft 506 of the trigger 50 has to be drawn to release the locked state between the sliding frame 20 and the fixed frame 10. Next, the handle 30 has to be pushed, such that the sliding frame 20 returns along the guide channels 106 of the fixed frame 10 to the initial position. Subsequently, the shaft 506 of the trigger 50 is released, such that the protrusion 608 of the locking member 60 is engaged with the recess 218 of the sliding frame 20 and the recess 118a of the fixed frame 10 again. Thus, the linkage assembly 3 returns to the closed state (FIG. 8A).

As mentioned above, the invention provides a latch mechanism applicable to a Blade server system for rapidly and conveniently locking the blade servers 2 in the rack 1 or drawing the blade servers 2 out of the rack 1. Moreover, the latch mechanism is also applicable to other electronic devices having removable mechanism.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A latch mechanism, comprising:
   a rack, having a restricting structure; and
   a linkage assembly, connected to an electronic device in the rack, wherein the linkage assembly includes:
   a fixed frame, connected to the electronic device;
   a sliding frame, movable along a first direction relative to the fixed frame;
   a handle, connected to the sliding frame;
   a trigger, movably disposed between the handle and the sliding frame; and
   a latch member, connected to the fixed frame and the restricting structure to restrict the electronic device in the rack;
   wherein when an external force is exerted on the trigger and the handle to move the sliding frame along the first direction relative the fixed frame, the trigger pushes the latch member to separate from the restricting structure along a second direction perpendicular to the first direction, such that the electronic device can be drawn out of the rack.

2. The latch mechanism as claimed in claim 1, wherein the linkage assembly further includes a locking member disposed on the sliding frame and engaged with the fixed frame to restrict the sliding frame moving relative to the fixed frame.

3. The latch mechanism as claimed in claim 2, wherein the trigger is movably connected to the sliding frame, and when the trigger moves along the first direction relative to the sliding frame, the trigger pushes the locking member to deform and separate from the fixed frame.

4. The latch mechanism as claimed in claim 3, wherein when the trigger moves along the first direction relative to the sliding frame, the trigger pushes the locking member to deform along a third direction, perpendicular to the first direction and the second direction.

5. The latch mechanism as claimed in claim 3, wherein the trigger includes a rod body, a first contact portion, and a second contact portion, wherein the rod body is extended along the first direction, and the first and second contact portions protrude from the rod body toward the second direction.

6. The latch mechanism as claimed in claim 5, wherein when the trigger moves along the first direction relative to the sliding frame, the first contact portion pushes the locking member to deform and separate from the fixed frame.

7. The latch mechanism as claimed in claim 5, wherein when the trigger moves along the first direction relative to the sliding frame and pushes the latch member, the second contact portion pushes the latch member to separate from the restricting structure along the second direction.

8. The latch mechanism as claimed in claim 1, wherein the latch member includes an inclined surface, and when the trigger pushes the latch member, the trigger pushes the inclined surface to separate the latch member from the restricting structure along the second direction.

9. The latch mechanism as claimed in claim 1, wherein the linkage assembly further includes a first spring connected to the sliding frame and the trigger.

10. The latch mechanism as claimed in claim 1, wherein the linkage assembly further includes a second spring connected to the fixed frame and the latch member.

* * * * *